United States Patent [19]
Mayfield

[11] 3,976,942
[45] Aug. 24, 1976

[54] WATT/WATT HOUR TRANSDUCER HAVING CURRENT SIGNALS AND A MODULATOR THEREFOR

[75] Inventor: Glenn A. Mayfield, Columbus, Ohio
[73] Assignee: Esterline Corporation, New York, N.Y.
[22] Filed: Dec. 13, 1974
[21] Appl. No.: 532,500

[52] U.S. Cl. .................................. 324/142; 332/9 R
[51] Int. Cl.² ......................................... G01R 21/06
[58] Field of Search ..................... 324/142; 332/9 R

[56] References Cited
UNITED STATES PATENTS

| | | | |
|---|---|---|---|
| 3,500,200 | 3/1970 | Woodhead | 324/142 |
| 3,655,955 | 4/1972 | Brendle | 324/142 UX |
| 3,673,495 | 6/1972 | Riebs | 324/142 |
| 3,725,774 | 4/1973 | Stewart | 324/142 |
| 3,775,683 | 11/1973 | Barta et al. | 324/142 |
| 3,794,917 | 2/1974 | Martin et al. | 324/142 |

Primary Examiner—Gerard R. Strecker
Attorney, Agent, or Firm—Frank H. Foster

[57] ABSTRACT

A watt/watthour meter of improved accuracy and relatively lower cost than a conventionally designed device with similar specifications. A current proportional to instantaneous power is obtained from a current-voltage multiplier circuit and is maintained as a current signal through amplifying and filtering, through the watt output load and through integrating in the watthour section. The multiplier uses a chopper modulator which provides two identical output current sources both floating with respect to ground so that one may be connected to the watt output amplifier and one to the watthour integrator. The signal from the power line which is proportional to the voltage modulates the signal which is proportional to the power line current by alternatively switching the modulated current between the two source outputs and by maintaining zero average input current flow from the modulated current signal through use of dc blocking capacitors.

14 Claims, 14 Drawing Figures

WATT/WATT HOUR TRANSDUCER HAVING CURRENT SIGNALS AND A MODULATOR THEREFOR

BACKGROUND AND OBJECTS OF THE INVENTION

The present invention relates generally to electrical power instrumentation and more particularly relates to a watt/watthour transducer for metering the rate and quantity of electrical energy transmission.

The conventional watt/watthour metering apparatus which is related to the present invention typically has voltage and current input scaling means for providing a signal proportional to power line voltage and a signal proportional to power line current. These signals are applied to a multiplier circuit which provides an output signal having a value substantially proportional to the power or rate or energy flow through the power line.

Some systems, such as that shown in U.S. Pat. No. 3,794,917, have a multiplier which includes a pulse width modulating circuit. In such a circuit, one of the input signals or a signal proportional thereto is modulated by the other input signal or a signal proportional thereto. The output of such a pulse width modulator arrangement consists of a series of pulses having a height proportional to the instantaneous value of either the current or voltage in the power line and having a pulse width proportional to the instantaneous value of the other.

The average value of this series of pulses is proportional to the instantaneous power of the power line. Consequently, the output of the modulator may be filtered and amplified to provide an output signal indicative of instantaneous power (actually power averaged over a very small time interval dependent upon the response time of the system which is typically less than a few seconds).

In addition, a signal proportional to the modulator output signal or the modulated output signal itself may be integrated with respect to time to provide a signal corresponding to total watthours of energy through the power line over a given time interval. The present invention relates to improvements in watt/watthour metering apparatus.

It is conventional in a circuit of the above type to utilize voltage signals and voltage devices. This means that the information contained at various points in the circuitry is related to the voltage between particular nodes rather than to the current flow. For example, the modulators of the prior art multiplier circuits ordinarily modulate the voltage related signal with the current related signal being the modulating signal. This is done because it is the current axis which must be maintained very linear in the circuitry. On most modulator circuits the modulating axis is more linear than the modulated signal axis. So most circuits modulate the voltage related signal with the current related signal. This provides an output voltage having an average value approximately equal to the instantaneous power of the power line.

This average voltage is then conventionally filtered and amplified by a voltage amplifier and subsequently converted to a current signal by a high output impedance amplifier to provide a current source output to the watt output load, such as a recording device. Even in a circuit providing a modulator output current proportional to instantaneous power, the current signal is conventionally converted to a voltage signal by sinking it through a resistance and then this voltage signal is amplified.

It is typical in the integrating section of the watt/watthour apparatus to provide circuitry which not only integrates the watt related signal with respect of time but quantizes the signal into a series of countable output pulses each pulse indicating a unit of energy. Such pulses may conveniently be counted or accumulated in a suitable register or counting device to indicate the total energy through the power line.

One problem with such conventional circuits which depend upon one or more voltage signals is that the offset voltages of typical op-amps drift and the voltage drops across various circuit elements such as the modulator cause considerable error. This error is a particular problem in equipment for which error tolerances must be kept within a percentage of reading rather than within a percentage of full scale because a small offset error may be a major portion of small reading. In fact, because of offset error one leader in the field has declared a charge compensation integrator to be unsuitable for watthour circuitry.

It is therefore an object of the invention to eliminate such voltage related error and to greatly improve the percent of reading accuracy of a watt/watthour transducer.

It is a further object of the invention to reduce the cost of a watt/watthour transducer by eliminating some components conventionally required and by minimizing the number of elements while at the same time increasing the accuracy of such circuitry.

In conventional circuits the modulator output signal which is proportional to instantaneous power is filtered and amplifier by a series of cascaded stages. Ordinarily, these consist of a filter stage followed by a voltage amplifier. Thus, in a typical design each cascaded stage performs its own particular function. To applicant's knowledge active filters have not been used in watt/watthour meters. Active filters are generally regarded as voltage input voltage output devices.

The pulse width modulator of a conventional multiplier circuit ordinarily has a voltage output. The voltage output makes it quite easy to send the voltage signal both to the watt output and to the watthour output sections. However, because of the errors caused by having voltage signals in a watt/watthour transducer, it is necessary for purposes of the present invention to have a modulator which can provide two current outputs both of which can be sunk to ground and which are absolutely identical so that one may be sent to the watt output section and one may be sent to the integrator of the watthour section.

It is therefore an object of the present invention to provide a pulse width modulator circuit having two current outputs both floating with respect to ground so that they can be sunk to ground in two different circuits and always of identical magnitude.

It is a further object of the invention to provide such a modulator exhibiting the high output impedance characteristic of current sources.

Further objects and features of the invention will be apparent from the following specification and claims when considered in connection with the accompanying drawings illustrating the preferred embodiments of the invention.

SUMMARY OF THE INVENTION

The invention is a watt/watthour transducer in which a high impedance current source proportional to the voltage or current in a power line is modulated to provide an output current proportional to instantaneous power in the power line and in which this output current is maintained as a current signal through the watt section and watt output load and through the integrator of the integrating - quantizing watthour section of the transducer.

The invention has a pulse width modulator circuit which derives a pair of current sources for sinking currents of substantially identical magnitude into two different loads to ground. This is accomplished by switching an input modulated source between the two loads and blocking dc current flow through the input source so that a zero average current flow is maintained through the modulated input current source. Whatever average current flows must flow through the two loads, one load appearing as a source, the other appearing as a sink for this average current. In a watt/watthour transducer one of these loads is the watt output section and the other load is the watthour section.

Figure 1:
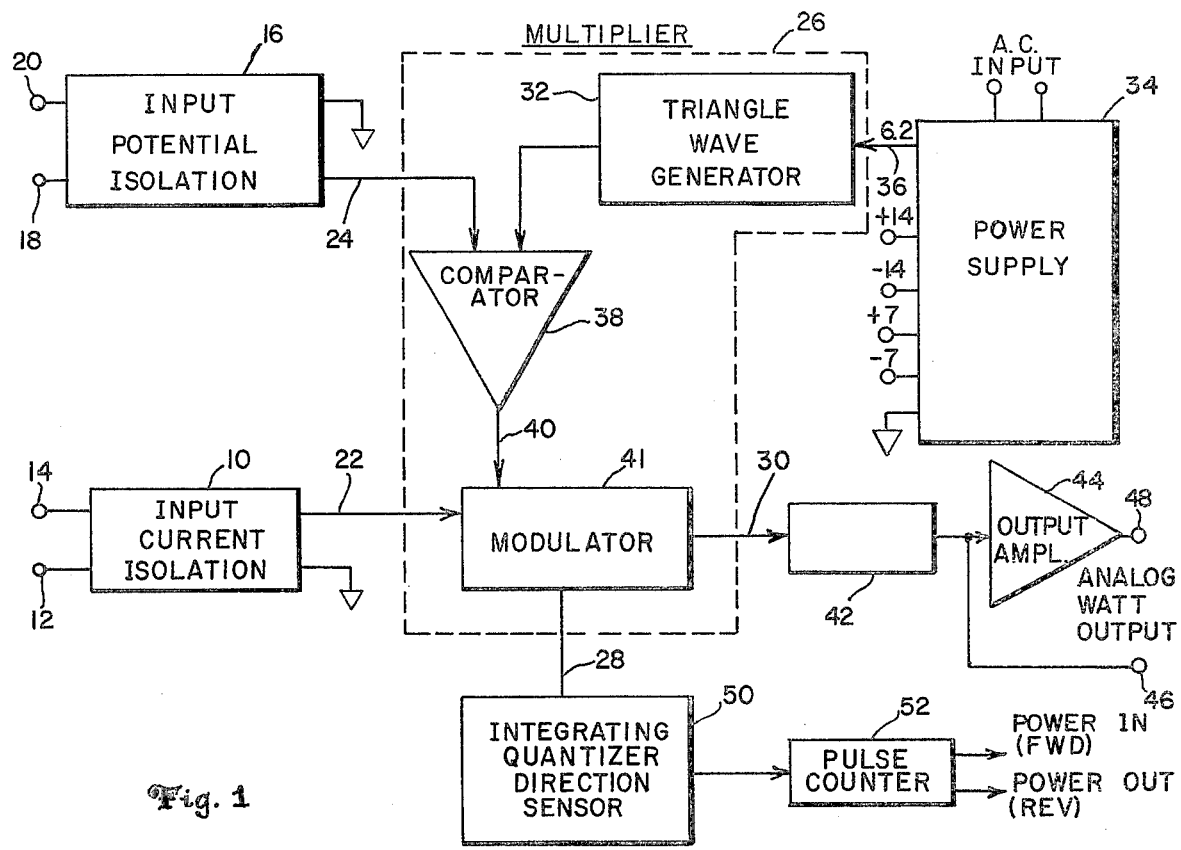
FIG. 1 is a block diagram of a complete watt/watthour transducer.

In describing the preferred embodiments of the invention illustrated in the drawings, specific terminology will be resorted to for the sake of clarity. However, it is not intended to be limited to the specific terms so selected and it is to be understood that each specific term includes all technical equivalents which operate in a similar manner to accomplish a similar purpose. For example, the terms "connected" or "coupled" may include connection through other circuit elements where such connection is recognized as equivalent and operates in essentially the same manner to accomplish the same purpose.

DETAILED DESCRIPTION

A watt/watthour transducer is a device for sensing the voltage and current in a power line, multiplying the voltage and current to obtain a watt output signal, and integrating a watt signal to provide a watthour output signal. Of course, when there is a power factor involved the multiplication must also include the cosine of the phase angle between the voltage and current.

FIG. 1 is a block diagram of the basic components of a watt/watthour metering system. Referring to FIG. 1, the system is isolated from the power line by means of an input scaling means connected to the power line and includes a current scaling means 10 having input terminals 12 and 14 which are series connected to the power line and a voltage scaling means 16 having input terminals 18 and 20 which are shunted across the power line. In this manner, a signal proportional to power line current is provided at the output 22 of the current scaling means 10 and a signal proportional to power line voltage is provided at the output 24 of the voltage scaling means 16.

Voltage scaling means 16 preferably comprises a potential input transformer which scales the power line voltage downward by a ratio of 120 to 1.4 to provide a nominal secondary voltage of 1.4 volts rms at the output 24 which is a replica of the power line voltage at the terminals 20 and 18. The input scaling means 10 preferably comprises a current transformer which typically scales the current down by a factor of 1000 to 1. Consequently, a 5 amp power line current would produce a 5 milliamp output current through the output 22 of the current scaling means 10.

These current and voltage signals are applied to a multiplier circuit 26 which in turn provides a signal proportional to power line power measured in watts at multiplier outputs 28 and 30. The preferred multiplier circuit accomplishes multiplication by means of pulse width modulation. In this system, the voltage or current signal is modulated by the other to provide an output train of pulses with amplitudes proportional to the amplitude of the modulated signal and a pulse width duration proportional to the modulating signal. The average value of this pulse train is proportional to power through the power line.

The preferred multiplier utilizes a triangle wave generator 32 referenced to a reference voltage derived by a power supply 34 at power supply output 36. The multiplier has a comparator 38 which compares the output of the triangle wave generator 32 with the scaled voltage signal at the output 24 of the voltage scaling means 16. The comparator output signal is applied as a modulating voltage to a modulator 41 to modulate the scaled current signal from the output 22 of the current scaling means 10.

The triangle wave generator 32 develops a triangular waveform which is preferably approximately 5.9 volts peak to peak and centered around ground. The scaled voltage signal is compared to the signal from the triangle wave generator 32 resulting in a pulse train from the comparator output 40 having an average frequency equal to the frequency of the triangle wave which is preferably approximately 600 Hz. The width of these pulses is proportional to the input voltage from the power line and their amplitude is of no consequence because the pulses are used to switch the chopper modulator 41. Thus, the triangle wave generator and comparator function together as an analog to pulse width convertor.

Multipliers of this general type for providing a single output which has an average value proportional to the power through the power line are known in the art having for example, been descriibed in U.S. Pat. No. 3,794,917. Consequently, further details are unnecessary as to the description of its operation. It might however, be preliminarily noted that most such prior art devices either provide a voltage output signal which consequently may be sent by means of outputs 28 and 30 to other portions of the circuit or they provide a single output current signal.

In this manner, pulses are derived having an amplitude proportional to power line current and a pulse width proportional to power line voltage. These are conventionally applied through multiplier output 30 to a filter 42 and an output amplifier 44 in order to obtain a smooth continuous average dc signal proportional to the power through the power line and to provide a high output impedance current source to apply current through some desired watt output load such as a recording or readout device or to some control system utilizing watt information connected at terminals 46 and 48.

The output 28 from the chopper modulator 41 applies the same watt related pulse train to a circuit for integrating the watt related signal with respect to time in order to provide a total energy or watthour output. Typically this is done by an integrator-quantizer circuit 50 which consists of an integrator which integrates the pulse train analog signal from the output 28 of the chopper modulator 41 and also performs an analog to digital conversion function by quantizing the integrated signal into a series of digital pulses. These digital pulses are then counted by a pulse counter 52 consisting of, for example, suitable counting registers. It might also be noted that the power supply of applicant's system may be a relatively conventional power supply providing 5 output voltages. These voltages are ±14 volts for the op-amps, ±7 volts for the chopper modulator and a +6.2 volt reference which is derived from a zener voltage reference diode.

1. Current Signals

Applicant has discovered that errors due to offset voltage, drift and other voltage related errors which detract from accuracy can be very substantially reduced by maintaining a current signal from the modulated signal input 22 through the chopper modulator 41 all the way through the watt output load connected at terminals 46 and 48 and through the integrator to the point where the watthour signal is converted to digital pulses. This has been done by constructing the chopper modulator, filter and output amplifier 42 and 44 and integrating quantizer 50 in such a way that a continuous current path extends through all these elements.

Essentially this is accomplished according to the present invention by developing a current source from one of the input signals and connecting the watt and the watthour sections in series to the output of an interposed multiplier so that the current source drives its current, which is modulated by the other input signal, through the series loads. The current path in the watt section extends through the watt output load.

The maintenance of a current signal requires the development of a high impedance current source from one of the input scaling means 10 and 16. The preferred high impedance current source is a current scaling means comprising a current transformer since such a transformer presents a high impedance current source at its secondary. However, it should be noted that a high impedance current source can be developed from the voltage scaling means 16 by the conventional impedance transformation techniques known to those skilled in the art.

The chopper modulator 41 is a switching means operated as a pulse width modulator and is connected to the high impedance current source to modulate that current source with the signal derived from the voltage scaling means through the comparator 38. In this manner, the output of the chopper modulator 41 is a plurality of current pulses having an instantaneous amplitude equal to the amplitude of the instantaneous signal from the high impedance current source and having a pulse width proportional to the instantaneous amplitude of the other signal, which is the voltage signal in the preferred embodiment.

Of course, it is also important that the pulse width modulating switching mean have substantially no current path which is capable of shunting any average current from the current being modulated which would bypass the circuits at the output of the switching means and that no substantial gate current be inserted from control input or gate of the switching means. For these reasons, the preferred switching means is comprised of complementary MOS/FET gating devices.

The current amplifier and filtering means is connected to the pulse width modulating switching means 41 and provides an output current from a high output impedance. This output current is proportional to the average current of the current pulses. Of course, the term "current amplifier" is used to denote an amplifier circuit having a current input and a current output with no intermediate conversion of a signal to a voltage. Thus, filtering and amplifying are accomplished with the current from the pulse width modulating switching means flowing through a current path extending through the amplifier and filter and through the output load.

If a watthour output is not desired, the single current can flow from the chopper modulator 41 through the watt output load and return to common. However, in the case of a watt/watthour transducer, the same continuous current path must also include the integrator 50. Thus, the modulator output current must be integrated with respect to time by means of a current integrator. This of course, again means that in order to obtain the improved accuracy, the current to the integrator must not be converted to a voltage signal prior to the integration operation.

The ideal equivalent circuits for the circuit described in this application have no shunt current paths which would provide a current bypass of the watt output load or the watthour integrator. The circuit also minimize non-ideal current shunt paths. For example, it has been determined that capacitive coupling in the modulator is on the order of 3–10 ppm, bias current of the output amplifier and of the watthour integrator are approximately 1 ppm, filter capacitor leakage is less than 1 ppm and board leakage is insignificant.

It is therefore an extremely important feature of applicant's invention that, although all prior art workers have provided circuits which operate upon voltage signals and consequently involve the conversion of signals to voltages, applicant, unlike the prior art workers, has maintained the signals as current signals and consequently has overcome voltage offsets, drifts and other voltage related errors. In addition to discovering this basis for improving the accuracy of the watt/watthour transducer, applicant has also discovered various circuits for more effectively accomplishing this improvement in accuracy by utilizing current signals.

Applicant therefore in the preferred embodiment has taken a current scaling transformer and sinks its secondary current through the watt output load through an interposed path which includes multiplying, filtering and amplifying functions. The sequential position of all these elements along the current path may be rearranged within the scope of the invention. This has never been done before and yet provides an order of magnitude greater accuracy. The same principle is applied to the integrating watt/watthour section.

2. Active Filter-current Amplifier Watt Output Stage

The improved current amplifier-filter which may be used in embodiments of the present invention performs the functions of filter 42 and the output amplifier 44 illustrated in FIG. 1 in one circuit. Its purpose is to receive the current pulses from the chopper modulator 41, which are the pulse width modulated current from the current scaling means 10, to convert those current pulses to a ripple free analog output current which is proportional to the instantaneous power of the power line and exhibit a high output impedance characteristic to the watt output load connected at terminals 46 and 48. For the reasons outlined above this current is not, at any stage, converted to a proportional voltage signal.

Figure 2:
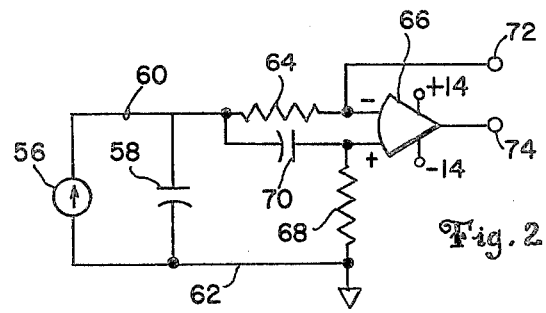
FIG. 2 is a simplified schematic diagram illustrating an amplifier-filter useful in embodiments of the present invention.

Referring now to FIG. 2, current source 56 represents the current pulse output from the modulator 41. A first capacitance 58 is shunted across the input current source to define an input terminal 60 and a common terminal 62. A first resistance 64 connects the input terminal 60 to the inverting input of an op-amp 66. The op-amp 66 is a low bias current amplifier having a very high forward current transfer ratio and may, for example, be a type LM 308 H. This very low zero drift op-amp has a second resistance 68 connected between its non-inverting input and the common terminal 62. A second capacitance 70 is connected to couple ripple signal from the input terminal 60 to the non-inverting input of the op-amp 66. An output load connected between the output 74 of the op-amp and the inverting input 72 sees an effective high output impedance current source.

The ripple that exists on capacitor 58 at terminal 60 is injected or coupled by means of a dc blocking coupling capacitor 70 onto the non-inverting input. Consequently, both op-amp inputs are effectively making the op-amp output swing with the ripple. The result is that the voltage of both output terminals 72 and 74 are together swinging up and down above ground potential with the ripple. The ripple signal therefore does not appear in the output load connected between terminals 72 and 74.

Since the inputs of op-amp 66 are substantially at ground potential, capacitor 58 is effectively shunted by the resistance 64 thereby creating a time constant equal approximately to the resistance of resistor R64 and the capacitance of capacitance 58. This time constant determines the first pole of the two-pole active filter. The second pole is determined by capacitance 70 and resistance 68. Additional poles could be added according to known techniques.

Figure 3:
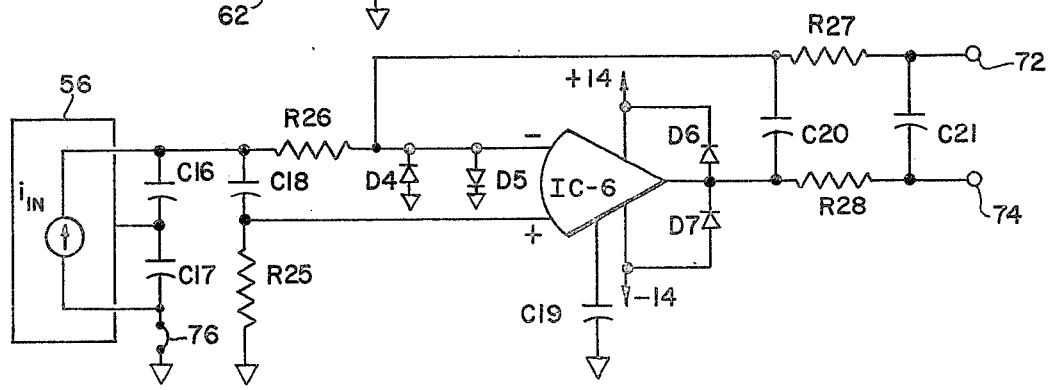
FIG. 3 is a schematic diagram of the preferred amplifier-filter circuit useful in embodiments of the present invention.

FIG. 3 illustrates the preferred circuit. It might be observed that the capacitor 58 in the actual preferred embodiment of the invention comprises a pair of capacitors C16 and C17 connected to a common internal ground by a jumper 76 but this is not necessary to other embodiments. Resistors 64 and 68 of FIG. 2 correspond to resistors R26 and R25 of FIG. 3 while capacitance 70 corresponds to capacitance C18. The circuit is protected from external transients by diodes D4, D5, D6 and D7. Resistors R27 and R28 as well as capacitors C20 and C21 provide additional transient protection according to conventional principles. Capacitor C19 is a conventional compensating capacitor for the op-amp. The following is a table of typical component values for the circuit of FIG. 3.

| TABLE OF TYPICAL VALUES | |
| --- | --- |
| C16 | 820 microfarads, 6 volts |
| C17 | 820 microfarads, 6 volts |
| C18 | 10 microfarads, 25 volts |
| R25 | 2.4 K ohms |
| R26 | 150 ohms |
| R27 | 470 ohms |
| R28 | 470 ohms |
| C20 | .02 microfarads |
| C21 | .02 microfarads |
| C19 | 150 pico farads |
| D4 | 1N914 |
| D5 | 1N914 |
| D6 | 1N914 |
| D7 | 1N914 |

3. Chopper Modulator Having Dual Identical Floating Current Outputs

Conventionally, the output signal of a modulator in a watt/watthour transducer is either a voltage signal or is a current which is converted to a voltage signal by sinking it through a resistance. Such a conventional voltage signal is easily connected to the filter and amplifier of the watt output section and to the integrating and quantizing watthour section. However, for the above stated reasons, it is advantageous to maintain every signal as a current signal. Applicant's circuit provides a modulator which can provide two outputs, each appearing as an effective current source and each floating with respect to ground so that one output may be connected to the watt output section and the other output may be connected to the integrating quantizer of the watthour section. It is essential that the currents from these two outputs be absolutely identical under all conditions. There must therefore, be two output terminals which are floating with respect to ground so that the watt section may be connected from one terminal to ground and the integrating-quantizing watthour section may be connected from the other terminal to ground.

Figure 4:
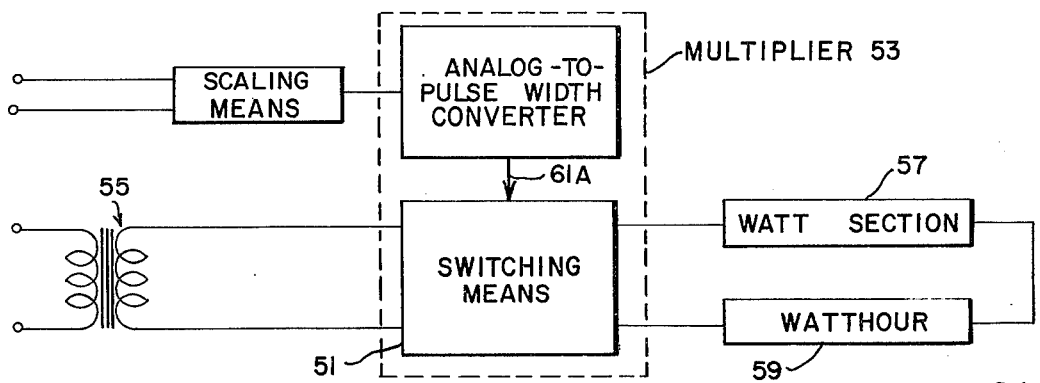
FIG. 4 is a simplified diagram illustrating the principle of the invention.

FIG. 4 shows a switching means 51 which includes an effective single pole double throw switching means and which is part of a multiplier 53. It is shown as a block to illustrate the fact that this term contemplates a wide variety of devices and combination of devices which are recognized in the art as serving switching functions. The term is of course not limited to mechanical devices and in fact solid state devices are preferred. Additionally, the term includes switching means which include devices which are switched by voltage or current of their switching terminals rather than by a signal at a control input terminal or gate. For example, a switching device might include one or more silicon bilateral switches.

The input of the switching means 51 is connected to the current transformer 55 and it has a pair of output terminals across which the series connected loads 57 and 59 are connected.

The circuits of FIGS. 5–9 illustrate alternative configurations embodying the invention. In all of them the switching means includes an effective wiper terminal as one input terminal of the switching means and connected to the current transformer which functions as a source of the signal being modulated.

All the alternative switching means 51a – 51c, 78 and 96 have a control input terminal 61A – 61F for switching the states of the switching means between its two states with time intervals proportional to the signal at the control port.

In all cases the switching means 51 connects at least one of the two load means 57 and 59 to the current source 55 in one state for driving current through it. In its other state the switching means 51 connects a current path across the transformer which has an impedance which is low relative to the impedance of the current transformer 55.

In the preferred embodiment the low impedance path is the second load means so that, preferably, the switching means alternatively connects each load means to the current transformer 55 as subsequently described.

Figure 5:
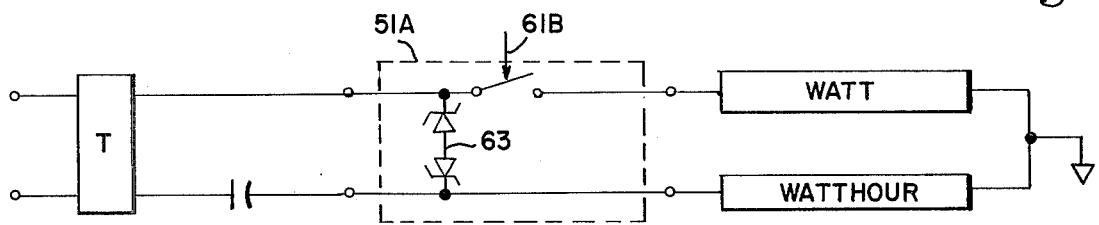
FIGS. 5, 6, and 7 are diagrams illustrating simplified alternative embodiments of the invention.
Figure 6:
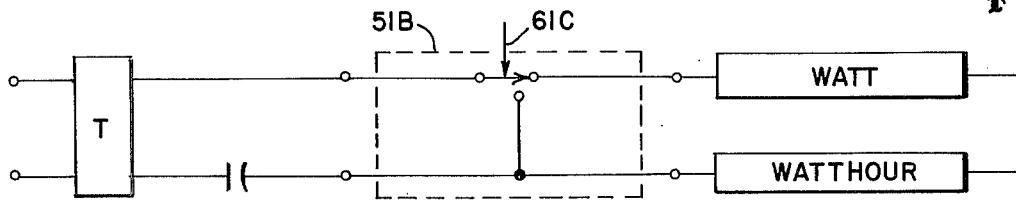

However, FIGS. 5 and 6 illustrate that in one state both impedances can be connected by the switching means to the current transformer and in the other state a capacitance or silicon bilateral switch can be connected across the transformer to prevent it from saturating while the load means are not connected to it. It should be noted that the silicon bilateral switch 63 of FIG. 5 operates as a part of the switching means to effectively provide a second "throw" actuated by the voltage across it.

Figure 7:
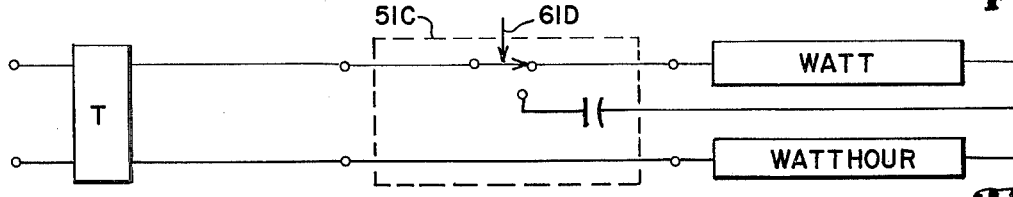

FIG. 7 illustrates that in one state both of the load means may be connected while one is connected in the other state. All of the circuits provide a single DC current path around a loop which includes the load means.

Figure 8:
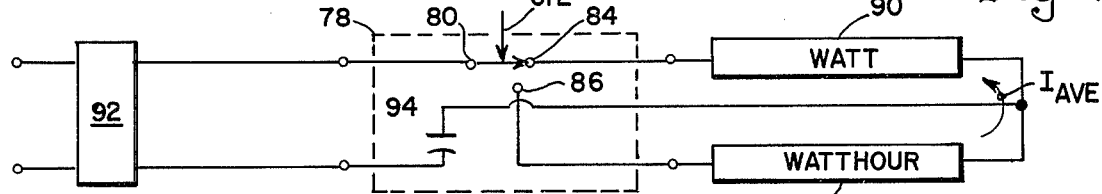
FIG. 8 is a simplified schematic diagram illustrating the chopper modulator of the present invention.

FIG. 8 illustrates principles involved with applicant's invention. The circuit has a single pole, double throw electronic switching means 78 having a wiper terminal 80, a control port 61E for switching the switching means 78 and a pair of output terminals 84 and 86 which are alternatively connectable by the switching means 78 to the wiper terminal 80. Since the circuit deals with current signals it is important that the switching means have no substantial interterminal leakage including none from the control input 61E.

A pair of output loads 88 and 90 have one terminal of each connected to a common ground and the other terminal of each connected to a different one of the output terminals 84 and 86 of the switching means 78.

A modulated signal source means 92, which in the preferred embodiment of the invention is the secondary of the current transformer of the current scaling means 10 illustrated in FIG. 1, is coupled to the wiper terminal 80 for at times driving current through the loads 88 and 90 depending upon the state of the switching means 78. However, at least one dc blocking capacitance 94 is connected in the coupling path from the modulated signal source means 92 to the loads 88 and 90 to maintain a zero average current flow through the modulated source means 92.

Finally, a modulating signal source means is connected to the control port 61E for switching the switching means 78 in accordance with the input modulating signal. In the preferred embodiment of the invention, the modulating signal is applied through output 40 of comparator 38 illustrated in FIG. 1.

The modulating signal is, of course, a signal for switching the switching means 78 between its two states. The modulating signal utilized in the preferred embodiment of the invention is a series of pulses each pulse having a pulse width proportional to the amplitude of the voltage from the voltage scaling means 16 of FIG. 1.

As the switching means 78 is alternatively switched by the modulating signal between its two states, the modulated signal source means 92 alternatively applies periodic current pulses to the loads 88 and 90. Because of the placement of the dc blocking capacitance 94 in series with the modulated signal source means 92, the average current through the source means 92 must be zero. However, the average current flow through the loads 88 and 90 is not so constrained and these loads will carry an identical average current $I_{ave}$ because they provide the only paths for such an average current to flow.

Consequently, considering the load 90 for example, this load will see current pulses having an instantaneous amplitude equal to the instantaneous amplitude of the modulated signal source means 92 and having a pulse width equal to the pulse width of the modulating signal at the control port 61E. As explained previously, the average value of these pulses is equal to the product of the voltage and current in the power line and consequently is proportinal to the power of the power lines.

The average current flowing in the load 88 must be identical to the average current in the load 90 since the load 88 provides the only path by which the average current through the load 90 can be returned to ground. Consequently, one of the loads appears to be functioning as a source of average current proportional to the power of the power line and of the other load appears to be a sink for an exactly identical current.

Figure 9:
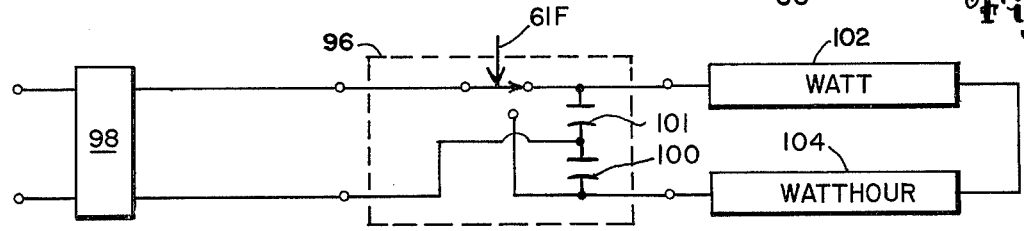
FIG. 9 is a schematic diagram of a simplified version of the preferred circuit embodying the chopper modulator of the present invention.

FIG. 9 illustrates a circuit embodying the concepts of the circuit of FIG. 8 but shows a configuration which is preferred for use in applicant's watt/watthour transducer. The circuit of FIG. 9 has a switching means 96 and a modulating signal source means 98 which preferably is the secondary of the current transformer located in the current scaling means 10.

However, in this circuit a pair of filtering capacitances 100 and 101 are series connected across the output terminals of the switching means 96 and have one terminal of the modulating signal of the source means 98 connected intermediate these capacitances. The capacitances 100 and 101 provide not only filtering of the output but additionally provide the average current blocking function which was provided by capacitance 94 in FIG. 8.

One of the output terminals of the modulator of FIG. 9 is connected to the watt output amplifier and filter 102 which is one effective modulator output load and the other output of the modulator is connected to the integrator-quantizer 104 of the watthour section which is another effective modulator output load.

The watt output section 102 is preferably the amplifier-filter circuit illustrated in FIG. 3. Referring to FIG. 3, the capacitances C16 and C17 of FIG. 3 are identically the capacitances 100 and 101 of FIG. 9. However, the jumper 76 of FIG. 3 would be removed and its two terminals are the terminals to which the watthour integrator-quantizer 104 is connected.

It is, of course, important that the outputs of the modulator illustrated in FIG. 9 appear to be high impedance current source outputs so that the loads connected thereto will not effect the current signal amplitude.

Figure 10:
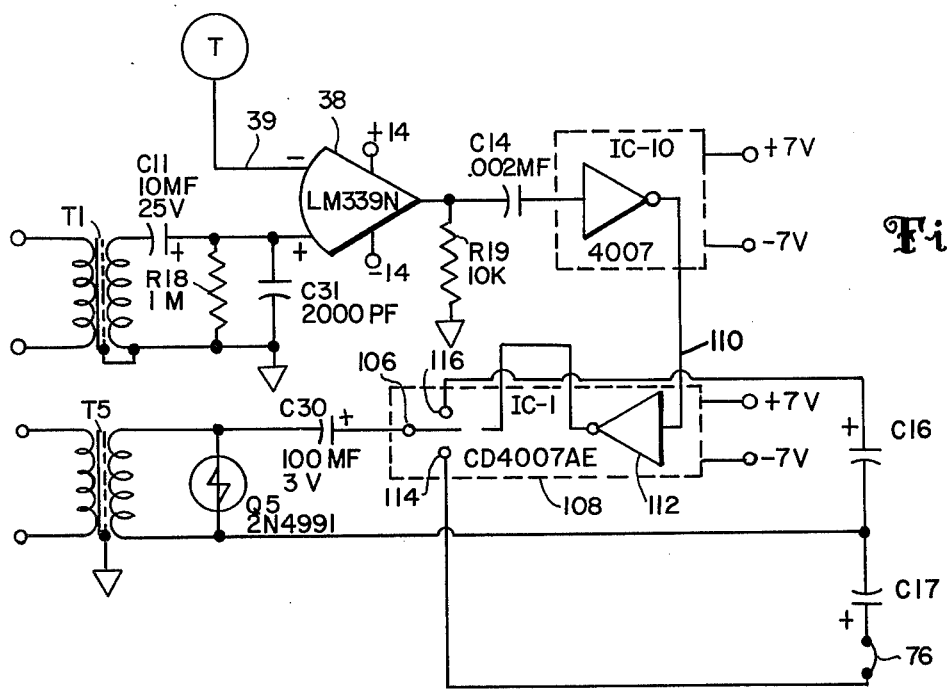
FIG. 10 is a schematic diagram of the complete preferred chopper modulator embodying the present invention.

FIG. 10 illustrates the details of the preferred modulator embodying the present invention. FIG. 10 illustrates the comparator 38 which is illustrated in FIG. 1 along with the voltage input transformer T1 and the current input transformer T5 which form respectively parts of the voltage scaling means 16 and current scaling means 10 illustrated in FIG. 1.

The secondary of the voltage transformer T1 is coupled by capacitance C11 and resistance R18 for phase shift correction of the transformer and by filter capacitor C31 to the non-inverting input of the comparator 38. The inverting input 39 of the comparator is connected to the triangle wave generator as previously described.

The secondary of the current transformer T5 is connected by dc blocking capacitor C30 to the wiper terminal 106 of the modulator switching means 108. A silicon bilateral switch Q5 is shunted across the secondary of T5 for transient suppression.

The preferred switching means is formed on an integrated circuit IC-1 which preferably is of the type CD4007AE. This IC uses complementary MOS/FET devices so that no average DC current is injected into the output signal from the control input port 110. Thus, MOS field effect devices are well suited to the present invention since their gates effectively conduct zero average current.

The output of the comparator 38 is coupled by coupling capacitor C14 to a C/MOS inverter and from there coupled to the input port 110 of the switching means 108 which contains an additional C/MOS inverter 112.

The capacitors C16 and C17 are connected between the output terminals 114 and 116 of the switching means 108 in the same manner that the capacitances 101 and 100 are illustrated in FIG. 9.

One very advantageous feature of this modulation system, in which the output current from the current transformer T5 is modulated by applicant's modulator, is the high output impedance presented to the two loads connected at the two dual outputs of the modulator. It is, of course, important that the modulator exhibit a high output impedance because the watt signal average output is a current signal which must not be effected by output loads.

The output impedance seen at the output terminals 114 and 116 of the switching means 108 is dependent upon the characteristic output impedance of the secondary of the transformer T5 and the effect the switching has upon that characteristic impedance.

The secondary of the transformer T5 would appears as a Norton equivalent current source and a parallel inductor. The inductive reactance of the parallel inductor is of course directly proportional to the frequency of the currents in that conductor.

While the power line frequency is 60 Hz, the chopping frequency is dependent upon the frequency of the triangle wave generator which may for example be 600 Hz. Consequently, the chopper modulator 108 may be chopping at a frequency ten times as great as the power line frequency. Therefore, the chopper modulator 108 is switching the current in the secondary of the current transformer T5 at a 600 Hz rate. Consequently, the output loads at the outputs of the chopper modulator 108 see an inductor which is being switched at a 600 Hz rate rather than a 60 Hz rate and consequently see an impedance which is 10 times greater than the impedance seen at the output of the secondary of the current transformer T5. With the same reasoning, the output impedance seen at the output of the chopper modulator 108 is even more greatly increased by increasing the chopping rates still further.

Experience has shown that the modulator system disclosed herein provides two currents one going to the analog watt output and the other going to the integrator-quantizer of the watthour section and which are equal to one part in $10^7$.

It can be seen from the above that the resulting effect of the modulator embodying the present invention is that an average current, which is proportional to the instantaneous power to the power line, flows along a path which extends from common ground through the 14 volt power supply, the op-amp IC-6 of the amplifier-filter illustrated in FIG. 3, the watt output load connected at terminals 74 and 72, R26 of FIG. 3, the modulator output terminals, the integrator-quantizer circuit and returning to common ground.

Another advantageous feature of this modulating configuration is that because the current signal is alternatively applied to two series connected output loads, the ripple produced is characteristic of full wave rectification i.e. 120 Hz ripple. This higher frequency ripple is not only easier to filter but also avoids the problems which arise if the watt output signal is applied to a 60 hz chopper stabilized load.

4. Precision Standard Current Sources

In order to obtain an integration of the current signal which is proportional to instantaneous power in the power line, it will become apparent that it is desirable to provide a pair of precisely equal standard current sources for use in the integration-quantizing circuitry.

Figure 11:
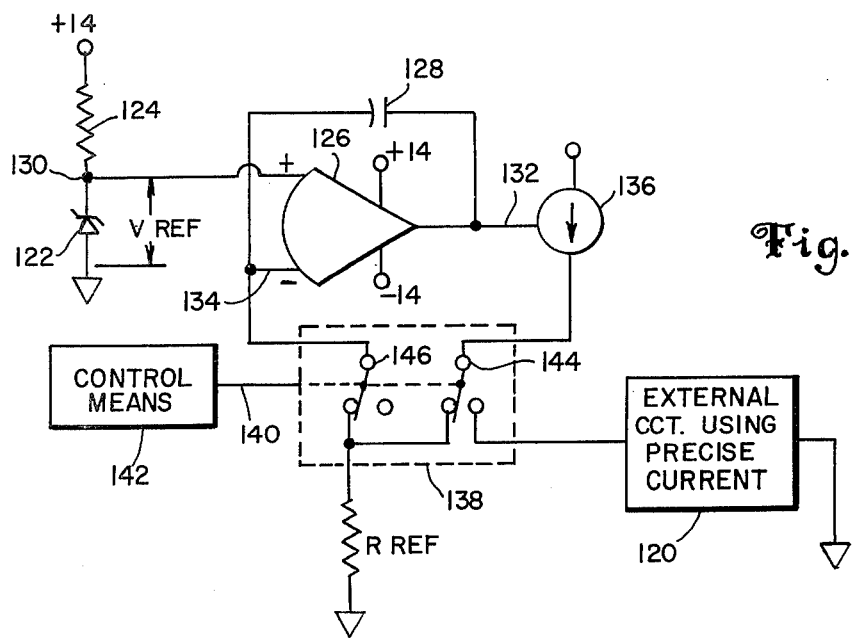
FIG. 11 is a simplified schematic drawing of a single standard precise current source.

FIG. 11 illustrates a basic simplified precision standard current source for occasionally supplying to an external circuit 120 which is connected to a common ground, a current pulse having a selected standard magnitude.

The standard current source circuit is referenced to a reference voltage $V_{ref}$ which may be derived from a series zener voltage reference diode 122 and resistance 124 connected to the power supply.

An op-amp 126 and capacitor 128 form a conventional op-amp integrator means circuit. The non-inverting input of the op-amp integrator is connected to the voltage reference terminal 130 and the integrating feedback capacitance 128 is connected between the output 132 of the integrator and the inverting input 134 of the op-amp 126. A controllable current source 136 is connected to the output 132 of the op-amp integrator circuit so that the current of the current source 136 is dynamically controlled by the op-amp integrator. A reference resistance $R_{ref}$ has a first one of its terminals connected to the common ground.

A double-pole, two-state switching means 138 connects these elements together and has a control port 140 which is connected to a control means 142 for switching the states of the switching means 138 as subsequently described.

The wiper terminals 144 and 146 of the switching means 138 are connected respectively to the current source 136 and the inverting input 134 of the op-amp integrator means. The other terminals of the switching means 138 are connected as indicated so that in one state of the switching means 138 both the current source 136 and the inverting input 134 of the op-amp integrator circuit are connected to the non-grounded terminal of the reference resistance $R_{ref}$.

In the other state of the switching means 138, both the current source 136 and the inverting input 134 are disconnected from the reference resistance $R_{ref}$ and the current source is connected to the external circuit 120 which utilizes the precise current pulse. The inverting input 134 is disconnected in order to disable the integrating means from performing its integrating function. However, the switch means could be effectively connected in other ways to accomplish this same purpose.

In the operation of the circuit in FIG. 11, the circuit begins with the switching means 138 in the state illustrated in FIG. 11. This will cause the voltage across the reference resistance $R_{ref}$ to be brought by the circuitry to essentially the same voltage as appears across the zener diode 122 and is equal to $V_{ref}$. The current through the resistance $R_{ref}$ will therefore be equal to $V_{ref}$ divided by $R_{ref}$. The purpose of this circuit is to provide current pulses having a magnitude equal to $V_{ref}$ divided by $R_{ref}$.

This current standard is quickly reached by the circuit. When the circuit is initially energized, the inverting input 134 of the op-amp 126 will begin at essentially zero volts while the non-inverting input of the op-amp 126 will be quickly brought to $V_{ref}$. This will in turn immediately cause the output 132 of the op-amp 126 to begin increasing very rapidly in the positive direction. As this occurs, current will begin flowing from the output 132 of the op-amp 126 through the capacitance 128 and through the reference resistance $R_{ref}$. Simultaneously, the increase of the output voltage of the op-amp 126 will begin increasing the current flow provided by the current source 136.

In this manner, the op-amp integrator circuit will continue integrating the difference between the voltage $V_{ref}$ and the voltage across $R_{ref}$ until the two are substantially equal. When such an equilibrium steady state condition is reached, the entire current through $R_{ref}$ will be provided by the current source 136. Therefore the voltage on the reference resistance $R_{ref}$ will be maintained identical to the reference voltage $V_{ref}$. Consequently, a precision current will be provided by the current source 136 to within the tolerances of the voltage reference diode 122 and the reference resistance $R_{ref}$.

This current source can occasionally be borrowed by the external circuit 120 by operation of the control means 142 to switch the switching means 138 to its other state. However, while the current source 136 is switched into the external circuit 120, it is essential that the integrator means be disabled so that its output does not significantly vary. In the preferred embodiment the inverting input 134 of the op-amp 126 is disconnected from the circuitry so that it will not be connected to a voltage which is different from $V_{ref}$.

If the inverting input 134 were connected momentarily to a voltage different from $V_{ref}$, and the integrator means were not disabled, it would immediately begin integrating the difference between $V_{ref}$ and this other voltage and change the current through the current source 136. However, by disconnecting the inverting input 134 and permitting it to float, the inverting input 134 will be maintained for a substantial length of time at the same potential which existed prior to its disconnection from reference resistance $R_{ref}$.

Consequently, it can be seen that the precise current source 136 may be borrowed for a length of time which is short relative to the discharge time constant for the discharging of capacitance 128. This discharge time constant will be extremely long since discharging current must flow through the extremely high input impedance of the inverting input 134 of the op-amp 126.

After the time interval of the precise current pulse, the switching means 138 is returned to the positions illustrated in FIG. 11 and the circuit returns to its former equilibrium.

One of the primary advantages of a current source embodying the present invention is that it may be used to provide a current source which has two outputs each providing output currents which are identical in magnitude because they are referenced to a single reference. This is termed a commonly referenced bipolar current source. Thus, by utilizing two circuits similar to that of FIG. 11 the circuit of FIG. 12 can be developed to provide a current pulse having a selected standard magnitude and flowing in either one of two opposite flow directions. Therefore, effectively, two different current sources are available to external circuitry each putting out a current pulse exactly equal to magnitude to the current pulse provided by the other but each providing its current pulse in opposite directions. These two current sources are maintained so nearly identical because both are referenced to the same reference voltage $V_{ref}$ and to the same single resistance $R_{ref}$. Not only are two identical current sources available but both can be sunk to ground; that is, the external circuitry utilizing both current sources may be connected between an output terminal and ground.

Figure 12:
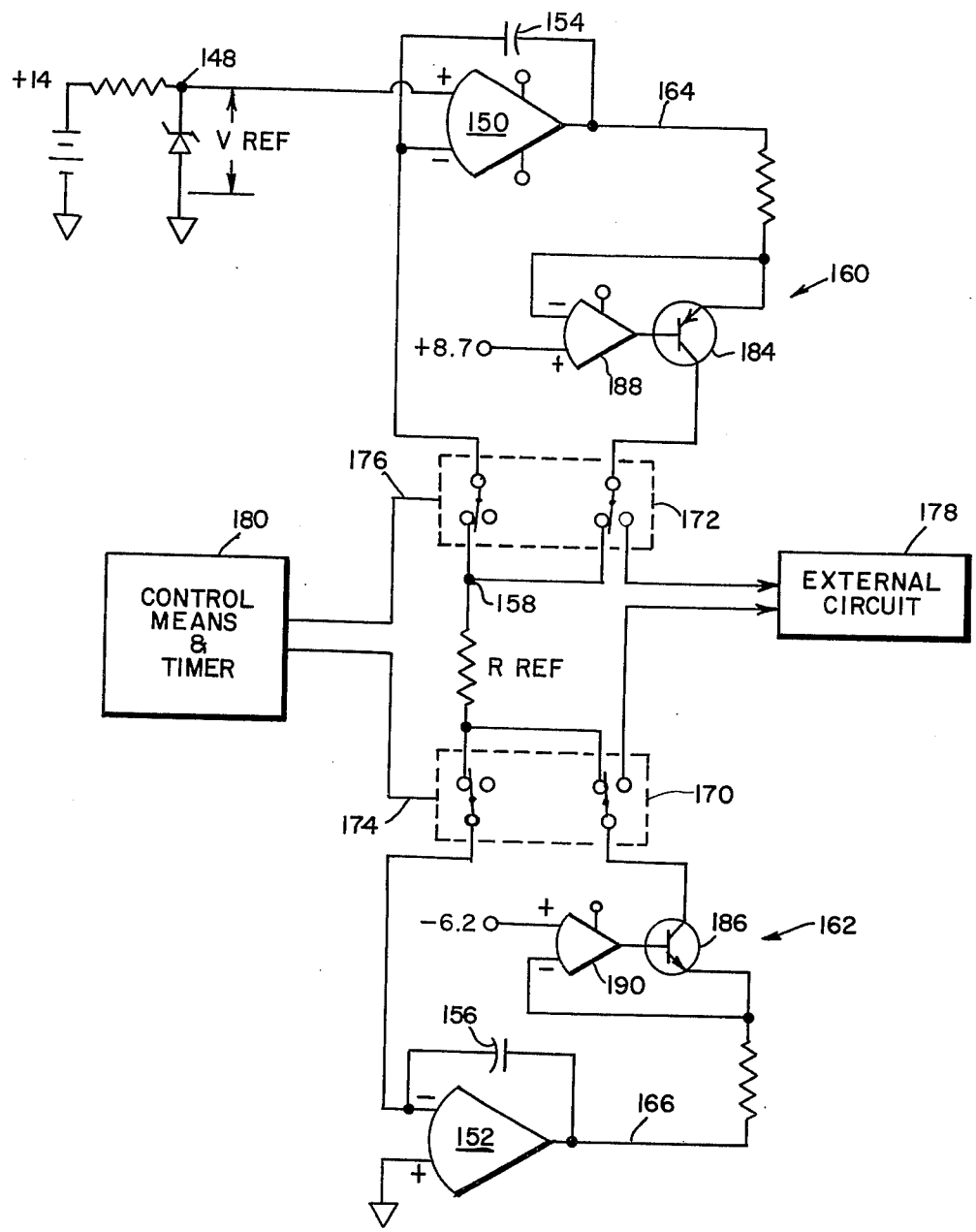
FIG. 12 is a schematic diagram of a bipolar current source.

The circuit of FIG. 12 like the circuit of FIG. 11 utilizes a single voltage reference means for developing a precise reference voltage $V_{ref}$ between a reference voltage terminal 148 and the common ground.

This circuit utilizes a pair of differential input op-amp integrator circuits, one utilizing op-amp 150 and the other utilizing op-amp 152. Each op-amp integrator circuit has its integrating feedback capacitance 154 and 156 respectively connected between its output and its inverting input. The non-inverting input of the op-amp 150 is connected to the reference voltage terminal 148 to integrate the difference between the reference voltage and the voltage at one terminal 158 of the reference resistance $R_{ref}$.

The non-inverting input of the other op-amp 152 is connected to the common ground to maintain the opposite terminal of $R_{ref}$ at virtual ground.

A pair of complementary controllable current sources, indicated generally as 160 and 162, are each connected to a different one of the outputs 164 and 166 of the op-amps 150 and 152 respectively. The current of each of the current sources 160 and 162 is dynamically controlled by the op-amp to which it is connected in the same manner that the current source of FIG. 11 is controlled by its associated op-amp.

These current sources 160 and 162 are termed complementary because their currents flow in opposite directions relative to the common ground. This means, of course, that they are directed so that in the series connection of both sources with $R_{ref}$, both generate current flow in the same direction through $R_{ref}$.

The circuit of FIG. 12 further has a pair of double-pole, two-state switching means 170 and 172. Each having a control port 174 and 176 respectively. The switching means 172 is associated with the op-amp integrator circuit utilizing op-amp 150 and its connected current source 160 in the same manner that the switching means 138 of FIG. 11 is associated with the op-amp 126 and current source 136. Similarly, the switching means 170 is associated with op-amp 152 and its connected current source 162. Each of these switching means 170 and 172 has a first state for connecting the inverting input of its associated op-amp integrator circuit and the current source associated therewith to one of the terminals of the reference resistance $R_{ref}$. Each of the switching means 170 and 172 also have a second state for disconnecting its associated op-amp integrator and current source from the reference resistance for simultaneously connecting its associated current source to the external circuitry 178.

As with the single current source, the preferred circuit disconnects the input to the integrator means in order to disable the integrator means. With the bipolar source, both integrator means must be disabled when either current source is borrowed. They could be disabled in an alternative manner.

Preferably, therefore, the switching means 170 and 172 together have three states. One state is where the integrators and current sources are connected to opposite ends of the reference resistance. There are second and third alternative states where one or the other of the current sources 160 and 162 is connected to the external load. In both the second and third states both integrator means are disabled.

The switching means 170 and 172 are controlled at their respective control input ports 174 and 176 by a control means 180. This single control means 180 advantageously includes a precision timer for controlling the pulse width of the precise standard current output pulses.

Therefore, it can be seen that the circuit of FIG. 12 in effect comprises a pair of complementary current sources like that illustrated in FIG. 11, one connected to each end of the reference resistance $R_{ref}$. One is referenced to the reference voltage $V_{ref}$ and the other is referenced to ground and they provide complementary current sources occasionally connectable to the external circuitry 178.

The two current sources in more detail each comprise one of two complementary bipolar transistors 184 and 186 having its emitter resistively coupled to the output of its associated op-amp integrator circuit and its collector coupled to its associated switching means.

The transistors 184 and 186 are controlled in the conventional manner by differential input op-amps 188 and 190 each having its output connected to the base of its associated transistor, its inverting input connected to the emitter of the transistor and its non-inverting input connected to a reference voltage in the conventional manner.

5. Bi-directional Integrator

Figure 13:
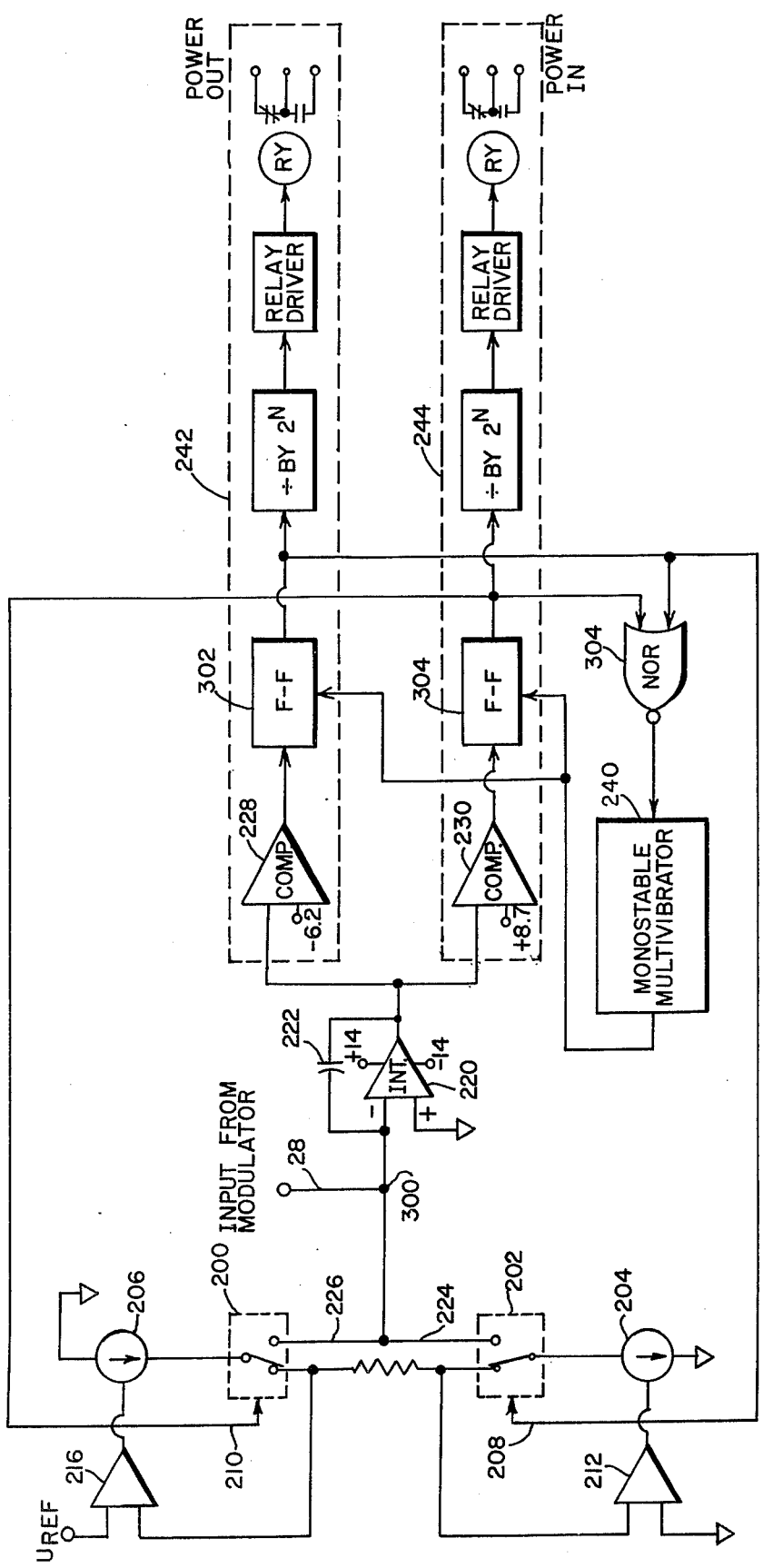
FIG. 13 is a diagram of the integrating and quantizing watthour section of a watt/watthour transducer.

The bi-directional integrator of the present invention is illustrated in FIG. 13. It utilizes a bi-polar standard current source like that illustrated in FIG. 12. However, in FIG. 13, the bipolar current source has been simplified for purposes of illustration. It is illustrated as of a pair of switching means 202 and 200 each associated with a current source 204 and 206 and each having a control input 208 and 210 respectively. The current sources are controlled by integrators 212 and 216 respectively as described above.

A differential input op-amp 220 is connected in an integrator circuit having the non-invertng input connected to the common ground and its integrating feedback capacitor 222 connected between its output and its inverting input. Both current output terminals 224 and 226 of the bipolar current source are connected to the inverting input 300 of the integrator circuit of op-amp 220. Also connected to the same inverting input 300 is the watt related signal from the modulator. Thus, the jumper 76 illustrated in FIGS. 3 and 10 is removed and the inverting input of the op-amp 220 is connected to the non-grounded side of the jumper. In this manner, the watt current signal is applied to the integrator-quantizer of the watthour section of the watt/watthour transducer.

A pair of comparators 228 and 230 each have one of their inputs connected to the output of the integrator circuit op-amp 220. One of the comparators 228 is referenced to a −6.2 voltage for switching the output state of the comparator 228 from its first state to its second state when the output of the integrator circuit op-amp 220 exceeds −6.2 volts. The other comparator 230 is referenced to a +8.7 volts for similarly switching its output state when the output of the integrator circuit op-amp 220 exceeds +8.7 volts.

The outputs of the comparators 228 and 230 are then applied to other logic and timing circuit elements which in turn are connected back to control the switching means 200 and 202 of the bipolar sources.

It can be seen that the bipolar current source in effect has three states. It has a first state for supplying no current at all, a second state for supplying a precise current pulse in one current flow direction and a third state for supplying a precise current pulse in the opposite flow direction.

The purpose of the logic and timing circuit means is first to switch the bipolar current source to its third state when the output of the integrator 220 is intermediate −6.2 volts and +8.7 volts. When the output of the integrator circuit of op-amp 220 minimally exceeds −6.2 volts, the logic and timing circuit elements switches the bipolar current source to whichever of its second or third states provides a current which reduces the charge on the integrating feedback capacitance 222 and thereby reduces the output voltage of the watthour integrator.

The circuit utilizes a quartz referenced monostable multivibrator 240 for controlling the pulse width of the precise pulses. Reverse and forward counting circuits 242 and 244 respectively are connected to the logic and timing circuit means for counting output pulses the number of which represent the integrated total of energy in watthours.

The operation of this circuit illustrated in FIG. 13 may now be considered.

In the operation of the circuit illustrated in FIG. 13, current pulses arrive at the input 28. The average value of these current pulses is proportional to the instantaneous power in the power line being metered. Consequently, the function of the circuit of FIG. 13 is to integrate the average value of these pulses with respect to time to provide a watthour output.

These incoming current pulses arrive at the inverting input of the integrator op-amp 220. This input 300 operates as a current summing point so that, with multiphase metering equipment each phase may have its own current and voltage scaling transformers and multipliers, the outputs of which are applied to this summing point.

Each incoming current pulse represents a quantum of charge which will be charged upon the capacitance 222 of the integrator. The current flow direction of these incoming pulses will be in one of two opposite directions representing either forward or reverse power flow through the power ine.

As charge accumulates upon the integrating capacitance 222, the voltage output level of the op-amp 220 will swing either in a negative direction or a positive direction depending upon the current flow direction of the incoming pulses.

If the incoming pulses cause the output of op-amp 220 to swing in the negative direction the swing will continue until it reaches −6.2 volts. Upon exceeding −6.2 volts, the output voltage of the op-amp 220 will switch the states of the comparator 228 which causes the flip-flop 302 to be set.

The switching of the flip-flop 302 to its set state in turn switches the switching means 202 so that the standard precise current of current source 204 is applied to the summing point input 300 of the integrator.

Simultaneously with the switching of the flip-flop 302 to its set state, a quartz referenced monostable multivibrator 240 is switched through a norgate 304 to begin a timing cycle. At the end of this precise timing cycle the flip-flop 302 is reset by the multivibrator 240 and consequently the switching means 202 is returned to its integrating position as illustrated in FIG. 13.

This set and subsequent reset of the flip-flop 302 produces a voltage pulse at its output and these may be counted by the counting circuitry 242.

During the time the precise current source 204 was applied to the input 300 of the integrator, removed or added charge from the integrating capacitance 222. This means that the bipolar sources 204 and 206 are arranged so that if current pulses at the input 28 from the modulator add charge to the capacitance 222 at one polarity then the bipolar current source subsequently connected to the summing point input 300 will move charge in the opposite direction.

Therefore the capacitance 222 of the integrator functions somewhat analogously to a large container into which small quantities of materials are periodically poured. Each time the level of material reaches a selected level of precise large quantity of material is removed.

In the circuit of FIG. 13 the precise quantity of charge removed from the capacitor is proportional to a precise quantity of energy flowing through the power lines. Consequently, the counting circuit 222 effectively counts the number of times that the precise quantity of charge is removed from the capacitance 222 and is easily correlated to total watthours of energy.

Of course, incoming current pulses of the opposite direction which make the outputs of the op-amp 220 rise toward a positive voltage level will eventually switch the state of the comparator 230 and cause a similar set and reset of the flip-flop 304. The flip-flop 304 in turn causes a precise current pulse to flow through the summing input 300 of the integrator, the pulse having an amplitude determined by current source 206 and a duration determined by the quartz referenced multivibrator 240.

As above each current pulse from the current source 206 represents a precise quantum of charge which is proportional to the energy flow through the power line.

Consequently, the counting circuitry 244 can count the number of times this precise quantity of charge is moved to the capacitor 222 and obtain an output proportional to total watthours of energy.

The voltage levels at which the removal of a quantum of charge is initiated is not significant nor would the occurrence of voltage drift be significant. This is because the quantum of charge is always identical if the current magnitude and pulse width of the pulses from the bipolar source are always the same.

Therefore voltage level plays no analog metering role, the metered quantities being current in the form of a flow of a discrete charge quantum and the number of such discrete charge quanta.

Figure 14:
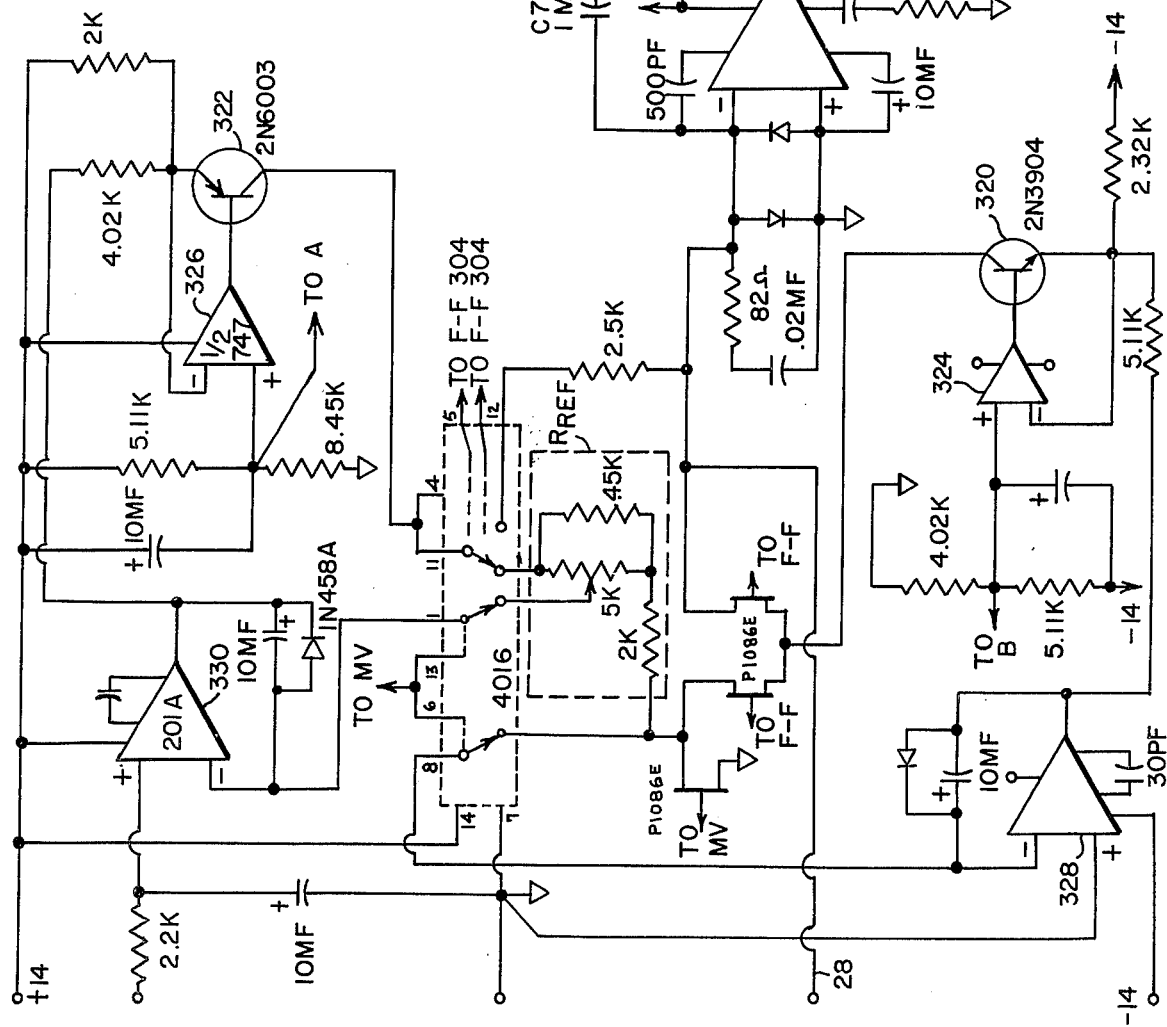
FIG. 14 is a schematic diagram of a portion of the preferred integrator and quantizer.

FIG. 14 represents the details of the preferred embodiment of the invention. Complementary bipolar transistors 320 and 322 along with their op-amps 324 and 326 provide the controlled current sources of the bipolar current source described above.

Op-amps 328 and 330 represent op-amps 152 and 150 of FIG. 12. Op-amp 332 corresponds to op-amp 200 of FIG. 13 while capacitance C7 corresponds to capacitance 222 of FIG. 13.

The reference resistance $R_{ref}$ comprises several resistances as illustrated on the diagram. The correspondence of other components is believed to be obvious to those skilled in the art and consequently further discussion is deemed unnecessary since FIG. 13 illustrates the principles of the present invention.

It is to be understood that while the detailed drawings and specific examples given describe preferred embodiments of the invention, they are for the purposes of illustration only, that the apparatus of the invention is not limited to the precise details and conditions disclosed and that various changes may be made therein without departing from the spirit of the invention which is defined by the following claims.

What is claimed is:
1. A method for metering an electrical power line from signals proportional to the instantaneous voltage and current of said power line, said method comprising:
   a. developing a high impedance current source from one of said signals;
   b. pulse width modulating the current of said current source through series connected watt section load means and watthour integrator load means with a modulating signal proportional to the amplitude of the other of said signals, said watt section load means providing an output proportional to the instantaneous power through said line and said watthour integrator load means providing an output proportional to the time integral of power through said line.

2. A method according to claim 1 wherein said modulating comprises chopping said current with chopping intervals proportional to the other of said signals.

3. A method according to claim 1 wherein current of said source is alternately applied to each of said load means and wherein a net average current is blocked from flowing through said current source.

4. An electrical power line metering apparatus comprising:
   a. scaling means connected to a power line and including a current input means and a voltage input means for providing electrical signals proportional to the instantaneous voltage and current of said power line, at least one of said input means effectively being a high impedance current source;

b. a watt section load means comprising an amplifier and filter circuit means having an input port which is the input port of said watt section load means and an output port and having no substantial shunt current path, for smoothing the current through it, and a watt output impedance connected across the output port of said amplifier and filter circuit means, said watt section load means providing an output proportional to the instantaneous power through said line;

c. a watthour integrator load means for providing an output proportional to the time integral of power through said line; and d. a multiplier circuit including a pulse width modulating switching means having an input port connected to said high impedance current source and an output port having said watt section load means and said watthour integrator load means series connected thereto, said multiplier circuit also having a control port connected to the other of said input means for chopping pulses of current source current through said series load means with chopping intervals proportional to the signal amplitude at said control port.

5. A circuit according to claim 4 wherein said switching means comprises a two state switching means for switching between its two states with time intervals proportional to the signal at said control port, said switching means in one state connecting at least one of the load means to said current source for driving current therethrough, and in its other state connecting a current path having an impedance which is low relative to the impedance of said current source in shunt to said current source, and in one of said two states connecting the second of said load means to said current source for driving current therethrough.

6. A metering apparatus according to claim 5 wherein said current input means comprises a current transformer and wherein said switching means modulates the current of said current transformer with the signal from said voltage input means.

7. A metering apparatus according to claim 6 wherein said switching means comprises complementary MOS/FET gating devices.

8. A circuit according to claim 5 wherein said switching means comprises a single pole double throw switching means having its wiper terminal connected to one terminal of said current source and its other terminals connected to said series connected load means.

9. A circuit according to claim 8 wherein a capacitance is connected between the other terminal of said current source and the node intermediate said load means.

10. A circuit according to claim 8 wherein a pair of series connected capacitances are connected across said other terminals of said switching means and wherein the other terminal of said current source is connected intermediate said capacitances.

11. An electrical power line combination watt and watthour metering apparatus of the type having a current input scaling means and a voltage input scaling means for providing a pair of electrical signals proportional to the instantaneous voltage and current of said power line, a multiplier connected to said scaling means for providing an output signal having an average value substantially equal to the instantaneous power through said power line, and an integrator means for integrating said output signal over a selected period of time to provide a signal corresponding to watthours of energy through said power line, wherein the improvement is a multiplier which includes:

a. a single pole, double throw switching means having a wiper terminal, a control input port and a pair of output terminals alternatively connectable to said wiper terminal, said switch means having no substantial interterminal leakage;

b. an amplifier load means connected to one of the output terminals of said switching means and a common for providing an output signal proportional to the instantaneous power through said power line;

c. said integrator means connected as a load means to the other output terminal of said switching means and said common;

d. a first one of said scaling means coupled at its output to said wiper terminal and said load means for at times driving current through said load means and having at least one dc block capacitance in its coupling path for maintaining a zero average current flow through said first scaling means; and e. an analog to pulse width converter means having an input connected to the output of the other of said scaling means for providing a series of pulses at a rate greater than the frequency of said power line and having a pulse width proportional to the amplitude of the output of said other scaling means, the output of said converter means connected to the control input of said switching means.

12. A circuit according to claim 11 wherein a series connected pair of capacitances are connected across the output terminals of said switching means and the output of said first one of said scaling means has one terminal connected to the wiper terminal of said switching means and its other terminal connected intermediate said pair of capacitances.

13. A circuit according to claim 12 wherein said scaling means comprises a current transformer having an output current proportional to the instantaneous current of said power line.

14. A current according to claim 13 wherein said switching means comprises a plurality of complementary MOS/FET transistors.

* * * * *